United States Patent
Fukuda et al.

(10) Patent No.: US 10,720,543 B2
(45) Date of Patent: Jul. 21, 2020

(54) PHOTODETECTOR

(71) Applicant: Nippon Telegraph and Telephone Corporation, Tokyo (JP)

(72) Inventors: Hiroshi Fukuda, Atsugi (JP); Shin Kamei, Atsugi (JP); Ken Tsuzuki, Atsugi (JP); Makoto Jizodo, Atsugi (JP); Kiyofumi Kikuchi, Atsugi (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/751,795

(22) PCT Filed: Aug. 28, 2016

(86) PCT No.: PCT/JP2016/003907
§ 371 (c)(1),
(2) Date: Feb. 9, 2018

(87) PCT Pub. No.: WO2017/038072
PCT Pub. Date: Mar. 9, 2017

(65) Prior Publication Data
US 2018/0233618 A1    Aug. 16, 2018

(30) Foreign Application Priority Data
Aug. 28, 2015   (JP) .................. 2015-169779

(51) Int. Cl.
*H01L 31/102* (2006.01)
*H01L 31/105* (2006.01)
(Continued)

(52) U.S. Cl.
CPC .......... *H01L 31/102* (2013.01); *H01L 31/028* (2013.01); *H01L 31/0264* (2013.01);
(Continued)

(58) Field of Classification Search
CPC ................. H01L 31/102; H01L 31/105; H01L 31/02327; H01L 31/028; H01L 31/035281; H01L 31/0264; H01L 31/022408
See application file for complete search history.

(56) References Cited

U.S. PATENT DOCUMENTS 7,616,904 B1    11/2009   Gunn, III et al.
2003/0102469 A1*  6/2003  Jones
(Continued)

FOREIGN PATENT DOCUMENTS

CN    102428399 A    4/2012
CN    105810774 A    7/2016
(Continued)

OTHER PUBLICATIONS

International Search Report dated Oct. 18, 2018, issued in PCT Application No. PCT/JP2016/003907, filed Aug. 16, 2016.
(Continued)

*Primary Examiner* — Benjamin Tzu-Hung Liu
(74) *Attorney, Agent, or Firm* — Workman Nydegger

(57) ABSTRACT

A germanium photodetector which reduces a dark current without degradation of a photocurrent includes: a silicon substrate; a lower clad layer formed on the silicon substrate; a core layer formed on the lower clad layer; a p-type silicon slab formed in a part of the core layer and doped with a p-type impurity ion; p++ silicon electrode sections that are highly-doped with a p-type impurity and act as an electrode; and germanium layers which absorb light. The germanium photodetector further includes an upper clad layer, an n-type germanium region doped with an n-type impurity above the germanium layer, and an electrode. According to the present invention, two germanium layers are provided on the p-type silicon slab so as to miniaturize the area of the surface of the individual germanium layer in contact with the p-type
(Continued)

silicon slab, so that the dark current due to threading dislocation can be reduced.

6 Claims, 17 Drawing Sheets

(51) Int. Cl.
*H01L 31/0224* (2006.01)
*H01L 31/0352* (2006.01)
*H01L 31/028* (2006.01)
*H01L 31/0232* (2014.01)
*H01L 31/0264* (2006.01)

(52) U.S. Cl.
CPC ............... *H01L 31/02327* (2013.01); *H01L 31/022408* (2013.01); *H01L 31/035281* (2013.01); *H01L 31/105* (2013.01)

(56) References Cited

U.S. PATENT DOCUMENTS

2010/0327385 A1   12/2010   Shiba et al.
2011/0012221 A1   1/2011    Fujikata et al.
2014/0138787 A1*  5/2014    Hellings

FOREIGN PATENT DOCUMENTS

| JP | 2001-68717 A | 3/2001 |
| JP | 5370857 B2 | 9/2013 |
| JP | 2014107562 A | 6/2014 |
| JP | 2014-192472 A | 10/2014 |
| WO | 2009/110632 A1 | 9/2009 |
| WO | WO2014120091 A1 | 7/2014 |
| WO | WO 2014/120091 * | 8/2014 |

OTHER PUBLICATIONS

International Preliminary Report on Patentability dated Mar. 15, 2018, issued in PCT Application No. PCT/JP2016/003907, filed Aug. 16, 2016.
Extended European Search Report dated Apr. 15, 2019 in corresponding European Patent Application No. 16841106.4.
Office Action dated Apr. 23, 2019 in corresponding Japanese Patent Application No. 2018-120129.
Li Chong et al., "High performance silicon waveguide germanium photodetector", Chinese Physics B, Chinese Physics B, Bristol GB, vol. 24, No. 3, Feb. 26, 2015, p. 38502, XP020281068.
Li Chong et al., "Sixteen-element Ge-on-SOI PIN photo-detector arrays for parallel optical interconnects".
Office Action dated Jan. 2, 2019 in corresponding Chinese Patent Application No. 201680048167.2.

* cited by examiner

PHOTODETECTOR

TECHNICAL FIELD

The present invention relates to a photodetector used in optical communications, and more specifically relates to a photodetector using germanium and formed on a silicon wafer.

BACKGROUND ART

As optical communications become popular in recent years, a reduction in cost of an optical communication device is requested. One of the solutions thereof is a method for forming an optical circuit constituting an optical communication device on a large-diameter wafer, such as a silicon wafer, by using a micro optical circuit technique such as silicon photonics. Thus, the material cost per chip can be dramatically reduced to achieve a reduction in cost of the optical communication device.

The examples of typical photodetectors formed on a silicon substrate using such technique include a monolithically-integratable germanium photodetector. FIG. 1 schematically illustrates the structure of a conventional waveguide-combined germanium photodetector. FIG. 2 is the cross sectional view along II-II in FIG. 1. Note that, for ease of understanding of the structure, in FIG. 1 a clad layer 103 and electrodes 116 to 118 illustrated in FIG. 2 are omitted, and only the positions at which the electrodes 116 to 118 are in contact with p++ silicon electrode sections 112, 113 and an n-type germanium region 115, respectively, are indicated by two-dot chain lines.

A germanium photodetector 100 is formed, on an SOI (Silicon On Insulator) substrate composed of a silicon substrate, a silicone oxide film, and a surface silicon layer, using a lithography technique and/or the like. The germanium photodetector 100 includes a silicon substrate 101, a lower clad layer 102 composed of a silicone oxide film on the silicon substrate, a core layer 110 for guiding signal light, a germanium layer 114 that is formed on the core layer 110 and absorbs light, and the upper clad layer 103 formed on the core layer 110 and germanium layer 114.

In the core layer 110, a p-type silicon slab 111 doped with a p-type impurity ion and the p++ silicon electrode sections 112, 113 that are highly-doped with a p-type impurity and act as an electrode are formed. The germanium layer 114 is stacked by epitaxial growth or the like, and has formed thereon the n-type germanium region 115 doped with an n-type impurity. Then, the electrodes 116 to 118 are provided on the p++ silicon electrode sections 112, 113 and n-type germanium region 115, respectively, so as to contact the latter.

Once light enters the core layer 110 and the light is absorbed by the germanium layer 114, then a photocurrent flows between the electrode 117 and the electrodes 116, 118, and therefore the germanium photodetector detects the light by detecting this current.

CITATION LIST

Patent Literature

PTL 1: Japanese Patent No. 5370857

SUMMARY OF INVENTION

However, conventional germanium photodetectors have a problem that the current when there is no incident light, or the dark current, is large.

The present invention has been made in view of such problem. It is an object of the present invention to provide a germanium photodetector which reduces a dark current without degradation of a photocurrent.

Solution to Problem

In order to solve the above-described problem, the invention according to claim 1 is a photodetector, comprising: a silicon substrate; a lower clad layer formed on the silicon substrate; a core layer that is formed on the lower clad layer and includes a p-type silicon slab doped with a p-type impurity ion; a germanium layer that is formed on the p-type silicon slab and includes an n-type germanium region doped with an n-type impurity; an upper clad layer formed on the core layer and the germanium layer; and electrodes connected to the p-type silicon slab and the n-type germanium region, respectively, wherein the germanium layer has a plurality of surfaces in contact with the p-type silicon slab.

According to another aspect of the present invention, the germanium layer includes the n-type germanium regions in plural corresponding to the plurality of surfaces in contact with the p-type silicon slab, and the electrodes comprise a set of electrodes including at least one first electrode connected to the p-type silicon slab common to the plurality of n-type germanium regions and one second electrode connected to the plurality of n-type germanium regions.

According to another aspect of the present invention, the core layer includes a plurality of input waveguide sections.

According to another aspect of the present invention, a plurality of surfaces in contact with the p-type silicon slab of the germanium layer each has a different area.

According to another aspect of the present invention, in the photodetector according to any of claims 1 to 3, the p-type silicon slab includes, on both sides of the germanium layer, a p++ silicon electrode section highly-doped with a p-type impurity, and the electrode connected to the p-type silicon slab is in contact with the p++ silicon electrode section.

According to another aspect of the present invention, the surfaces in contact with the p-type silicon slab of the germanium layer are arranged in series in the travelling direction of light.

According to another aspect of the present invention, the surfaces in contact with the p-type silicon slab of the germanium layer are arranged in parallel in the travelling direction of light.

Advantageous Effects of Invention

The present invention exhibits an effect of reducing only the dark current without degradation of the photocurrent of a germanium photodetector. Since a reduction of the dark current allows the S/N ratio to be increased and the receiving sensitivity to increase, a reduction in the power consumption of a transmitter and an increase of the transmission distance can be achieved.

DESCRIPTION OF EMBODIMENTS

As the causes of the dark current of a germanium photodetector, the following two types can be conceivable.

One is the dark current generated in the periphery of the surface in which the germanium layer 114 is in contact with the core layer 110 which is a silicon layer. This is caused by the crystal imperfection or the like of a peripheral portion, and the magnitude thereof is correlated with the peripheral length of a surface in which the germanium photodetector is in contact with the silicon substrate.

Another one is the dark current generated in a threading dislocation portion present in the inside of the crystal of the germanium layer 114. This is caused by a lattice mismatch between silicon and germanium, a difference between thermal expansion coefficients, and/or the like, and the magnitude thereof is correlated with the area of a surface in which the germanium layer 114 is in contact with the core layer 110 and the area of a surface in which the germanium layer 114 is in contact with the electrode 117.

Figure 1:
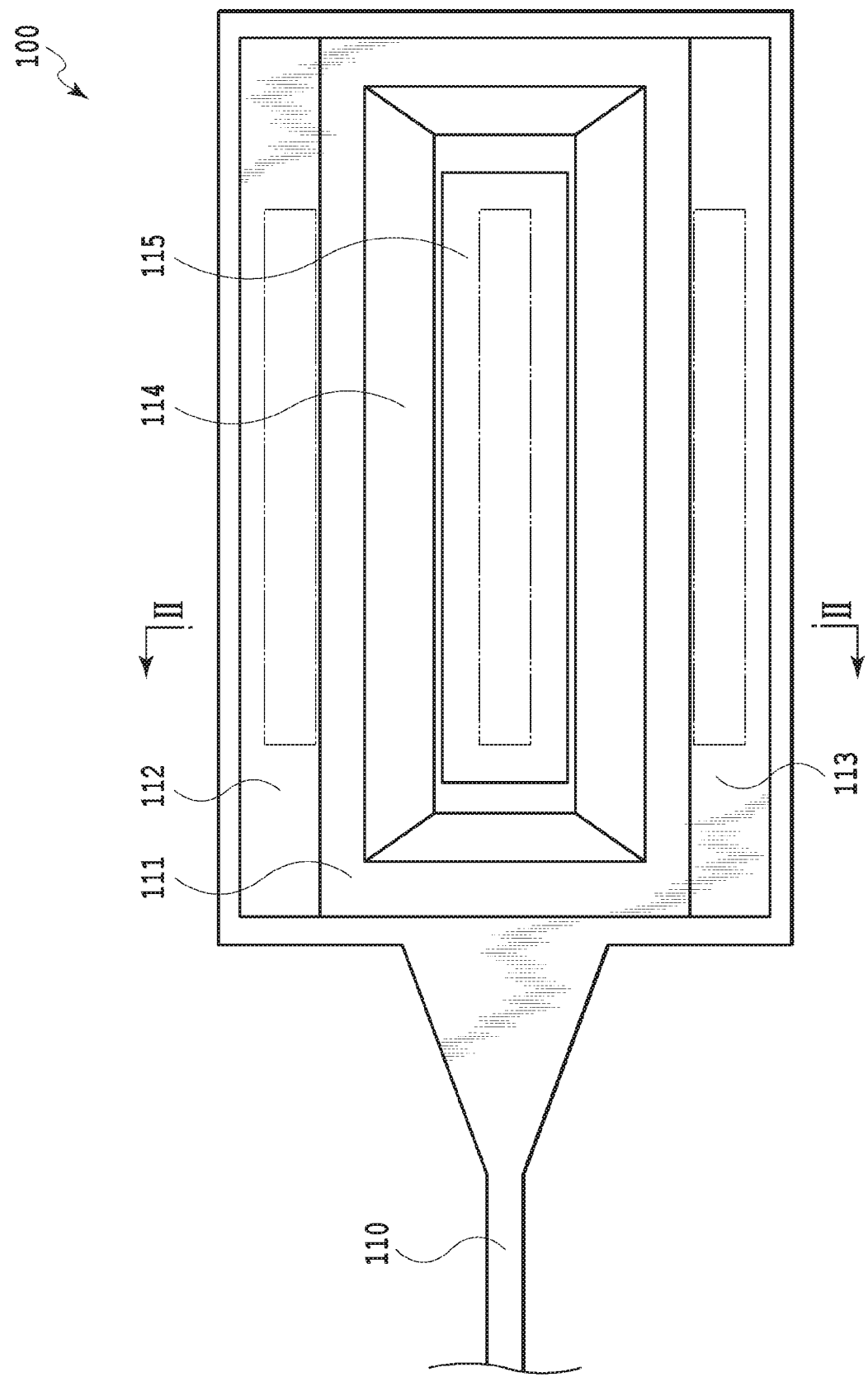
FIG. 1 schematically illustrates the structure of a conventional waveguide-combined germanium photodetector.
Figure 2:
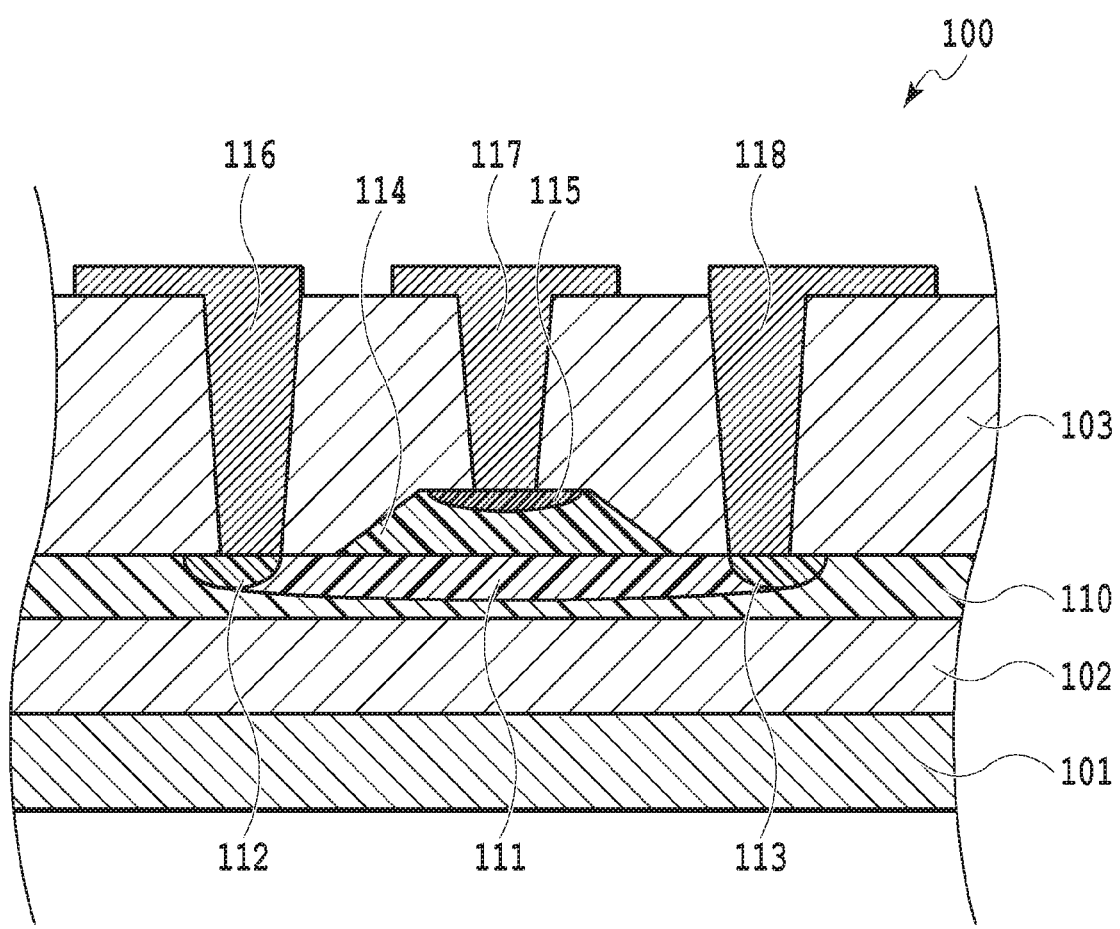
FIG. 2 is the cross sectional view along II-II in FIG. 1.

In the case of the configuration illustrated in FIGS. 1 and 2, the surface in which the germanium layer 114 is in contact with the core layer 110 refers to the bottom surface of the germanium layer 114 which absorbs light, while the surface in which the germanium layer 114 is in contact with the electrode 117 refers to the upper surface of the germanium layer 114.

Figure 3:
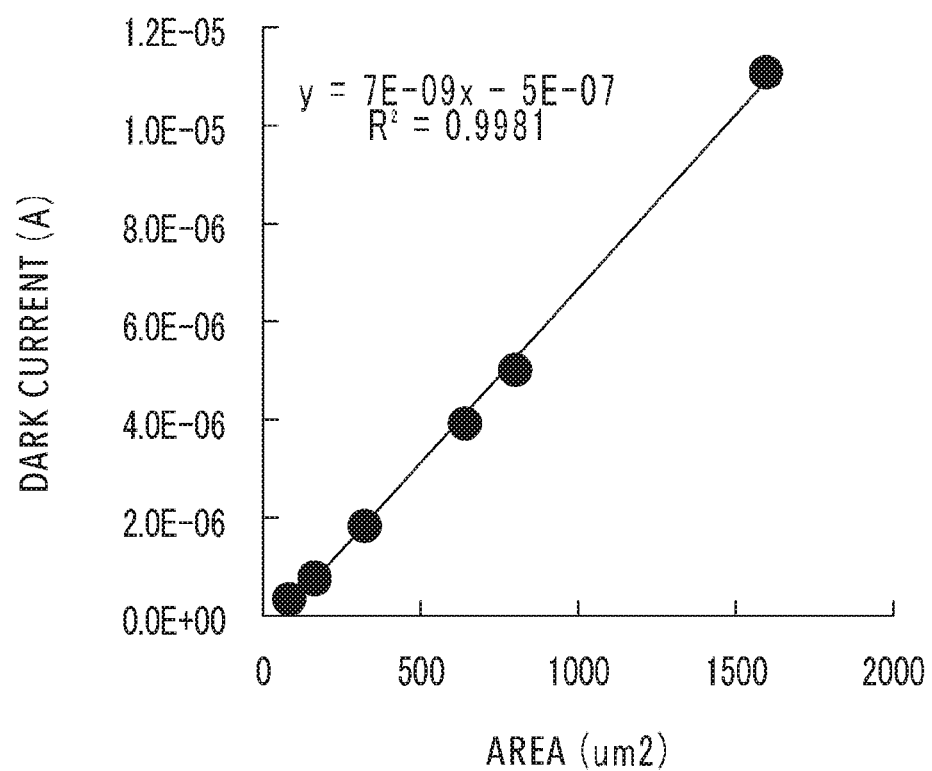
FIG. 3 illustrates the dark current of germanium photodetectors each having different dimensions of the bottom surfaces of a germanium layer, with the horizontal axis representing the area of the bottom surface.

FIG. 3 illustrates the dark current of the germanium photodetector versus the area of the bottom surface in contact with the core layer of the germanium layer. The vertical axis represents the dark current while the horizontal axis represents the area of the bottom surface in contact with the core layer of the germanium layer. The formula inside the view is the result of fitting by the primary formula, and it can be understood that the correlation between the area and the dark current is very high, and that the dark current is the one caused by threading dislocation. Moreover, the primary formula obtained by fitting has a negative intercept, but this may be because the dark current becomes 0 when the area of the upper surface of the germanium layer becomes 0. This may conclude that if the upper surface of the germanium layer becomes smaller relative to the bottom surface, the intercept of the relational formula between the area of the bottom surface and the dark current becomes smaller. This means that when the area of the upper surface becomes smaller even if the bottom surface has the same area, the dark current also becomes smaller. That is, the dark current might be able to be reduced by reducing the area of the upper surface of the germanium layer, i.e., the area of the surface of the germanium layer in contact with the electrode.

Figure 4:
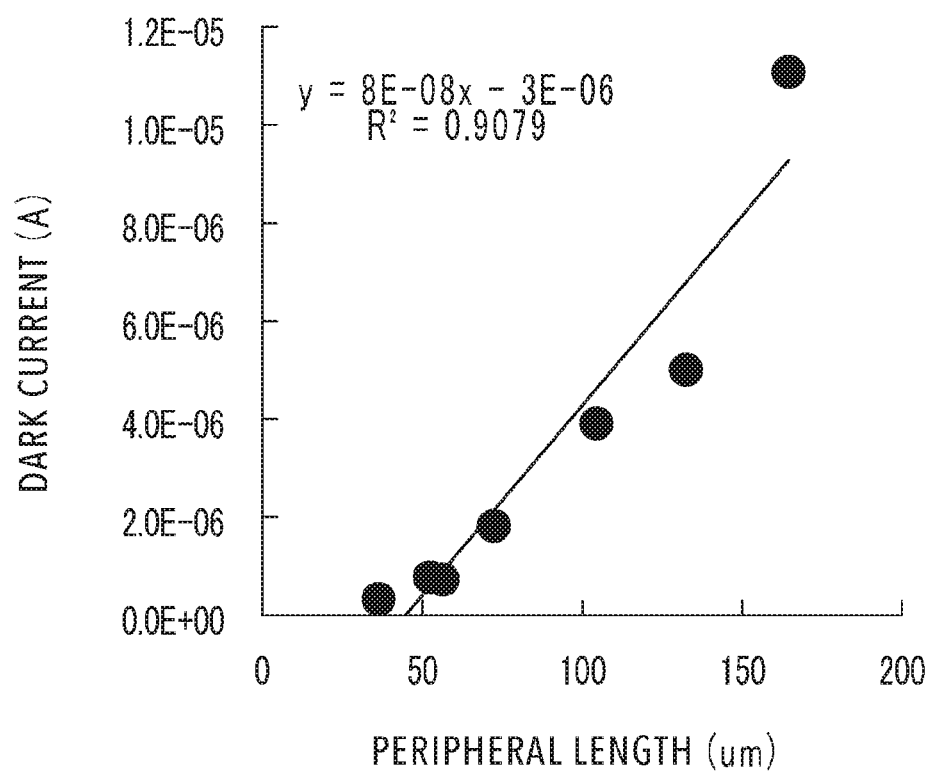
FIG. 4 illustrates the dark current of germanium photodetectors each having different dimensions of the bottom surfaces of a germanium layer, with the horizontal axis representing the peripheral length of the bottom surface.

Note that FIG. 4 illustrates the dark current of the germanium photodetector versus the peripheral length of the bottom surface of the germanium layer. The vertical axis represents the dark current while the horizontal axis represents the peripheral length of the bottom surface of the germanium layer. It can be understood that the correlation coefficient when approximated by the primary formula is small and thus the dark current is not the one caused by the peripheral length.

As explained above, it is understood from the results illustrated in FIGS. 3 and 4 that the threading dislocation due to the area might be able to be reduced in order to reduce the dark current of the germanium photodetector. Hereinafter, embodiments of the present invention will be described in detail.

First Embodiment

Figure 5:
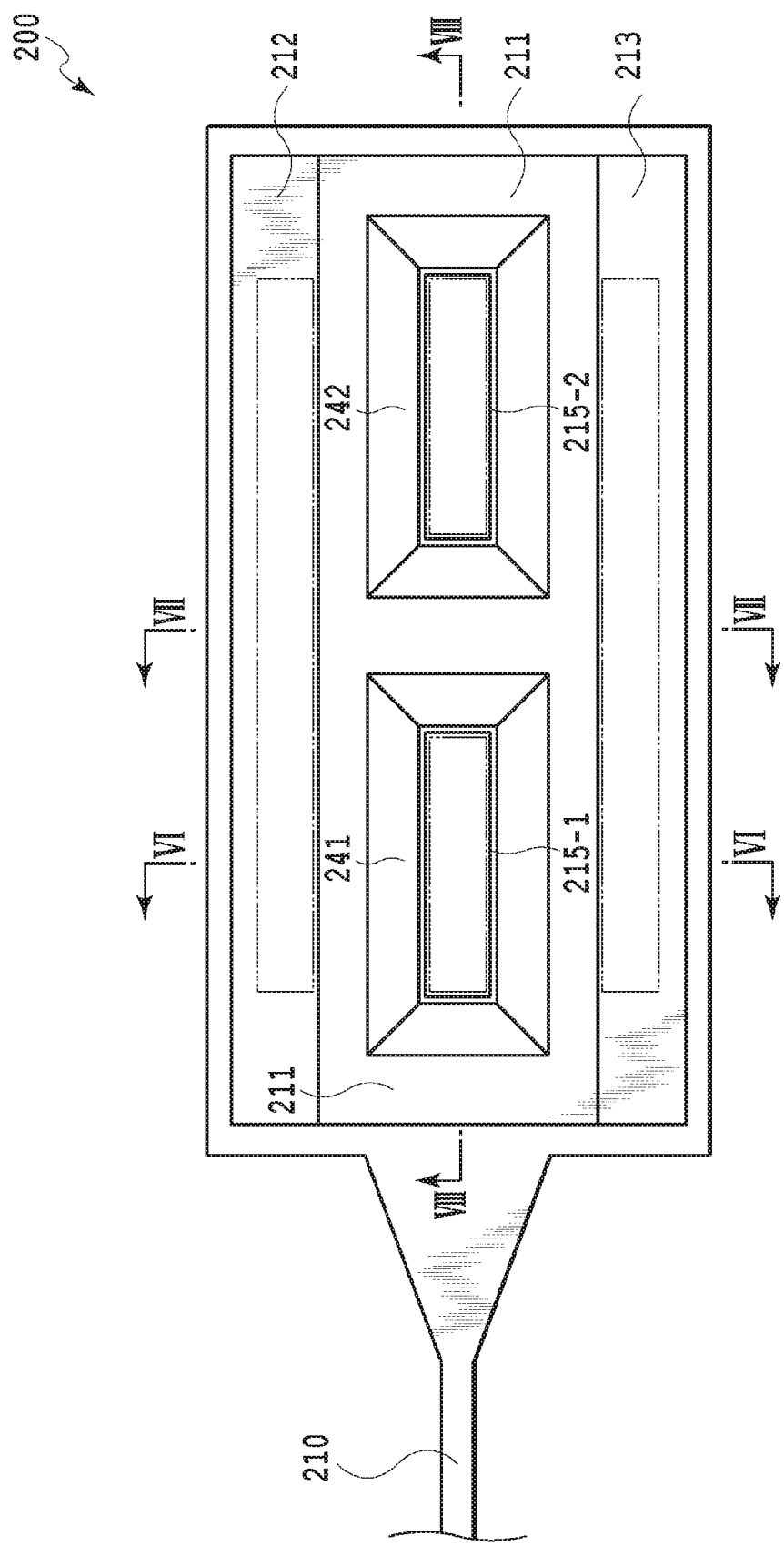
FIG. 5 is a plan view illustrating only a core layer 210 and germanium layers 241, 242 of a germanium photodetector according to a first embodiment of the present invention.
Figure 6:
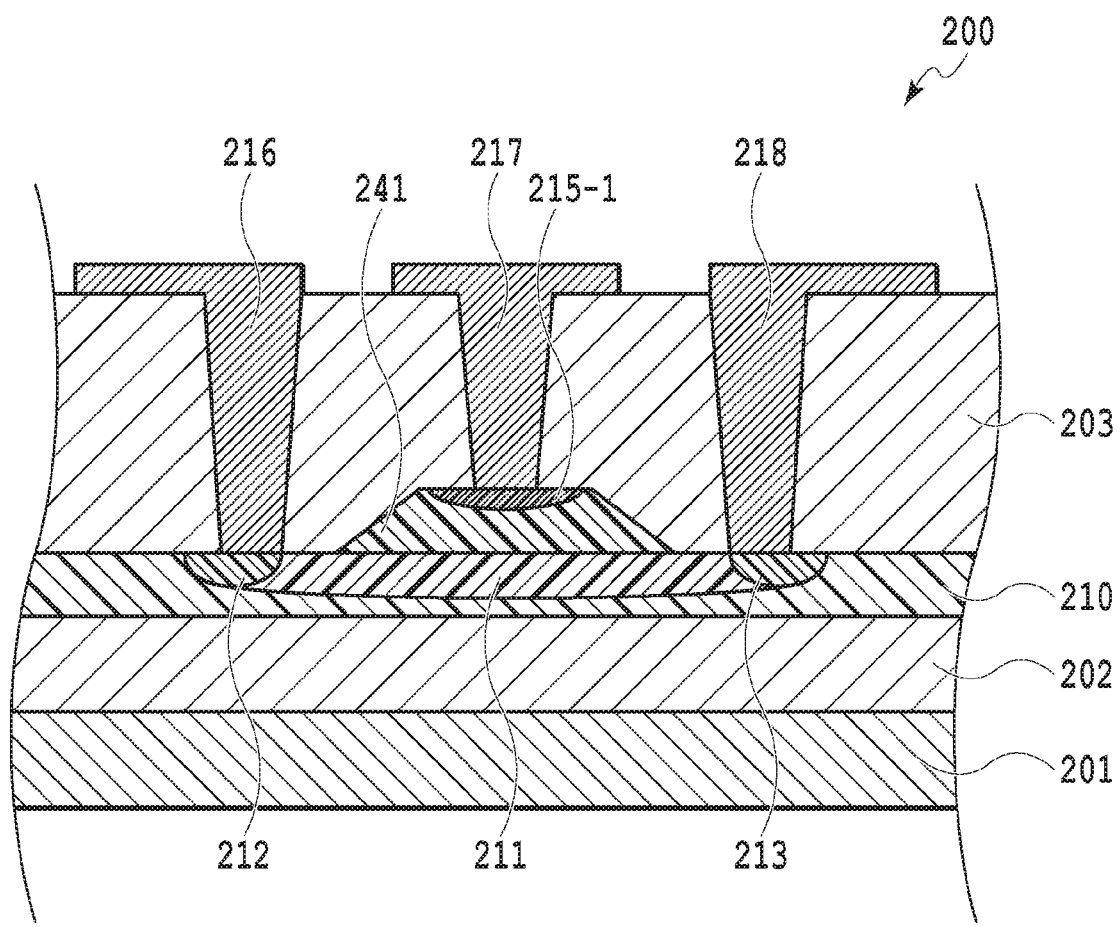
FIG. 6 is the cross sectional view along VI-VI in FIG. 5.
Figure 7:
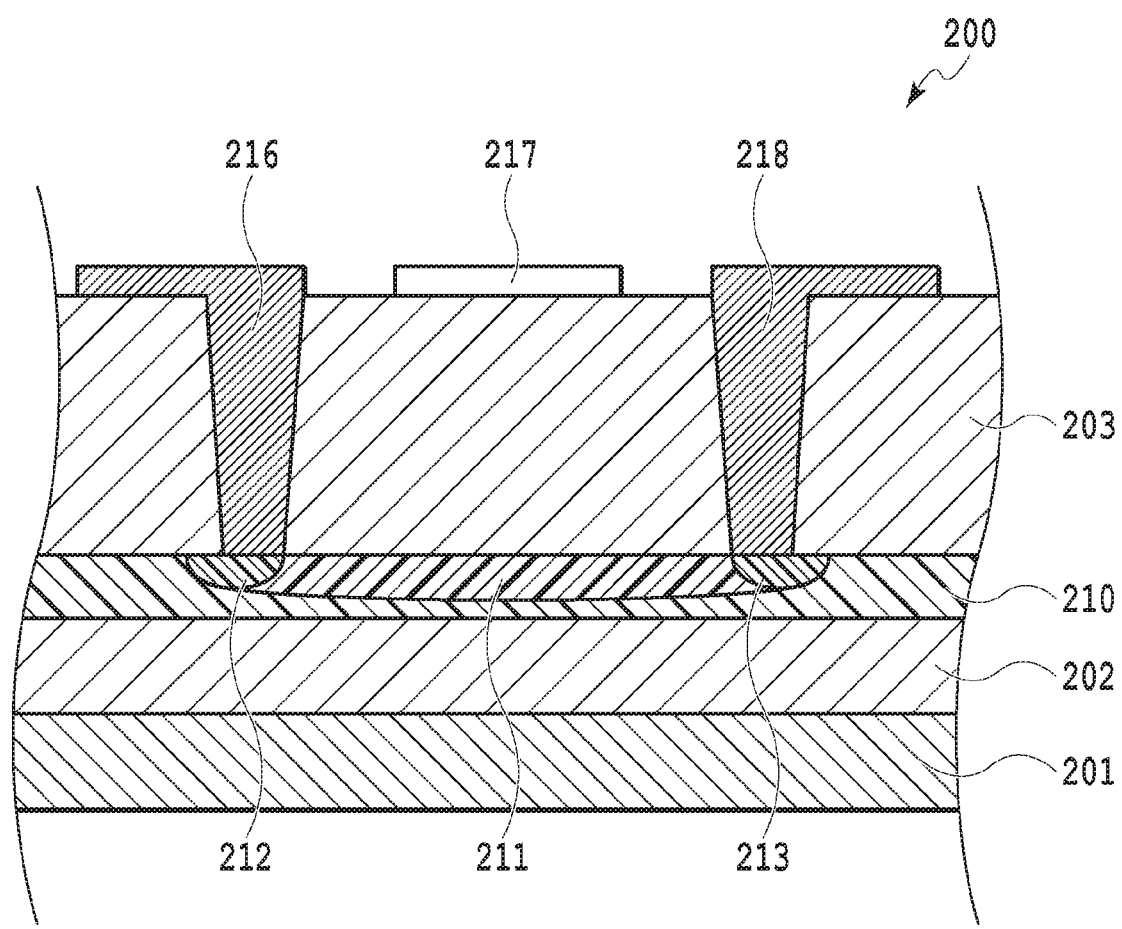
FIG. 7 is the cross sectional view along VII-VII in FIG. 5.
Figure 8:
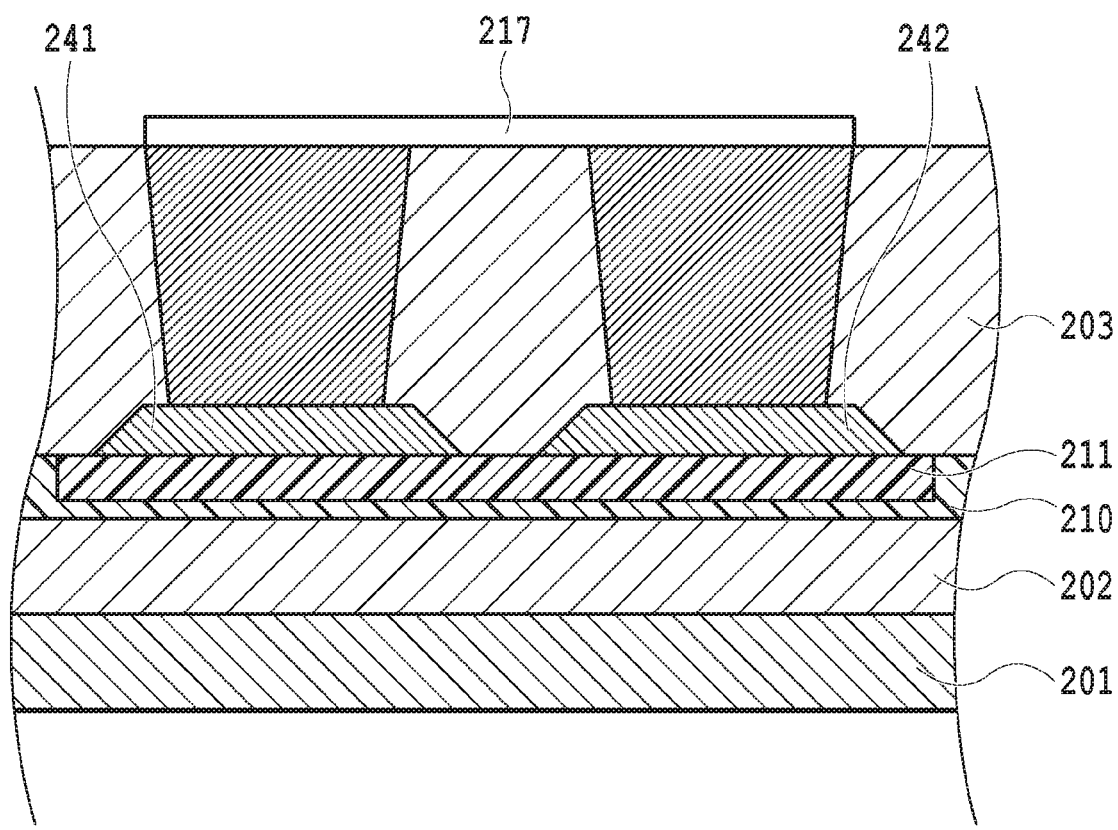
FIG. 8 is the cross sectional view along VIII-VIII in FIG. 5.

FIG. 5 is a plan view obtained by omitting an upper clad layer, a n-type germanium region doped with an n-type impurity above a germanium layer, and electrodes of a germanium photodetector 200 according to a first embodiment of the present invention. Moreover, FIG. 6 is the cross sectional view along VI-VI in FIG. 5, FIG. 7 is the cross sectional view along VII-VII in FIG. 5, and FIG. 8 is the cross sectional view along VIII-VIII in FIG. 5.

For ease of understanding, FIG. 5 illustrates only a core layer 210, a p-type silicon slab 211 doped with a p-type impurity ion and formed in a part of the core layer 210, p++ silicon electrode sections 212, 213 that are highly-doped with a p-type impurity and act as an electrode, germanium layers 241, 242 which absorb light, and n-type germanium regions 215-1, 215-2, and omits the upper clad layer and the electrode. In FIG. 5, the positions at which the electrode is in contact with the p++ silicon electrode sections 212, 213 and the n-type germanium regions 215-1, 215-2, respectively, are indicated by two-dot chain lines.

The germanium photodetector 200 is formed, on an SOI substrate composed of a silicon substrate, a silicone oxide film, and a surface silicon layer, using a lithography technique and/or the like. The germanium photodetector 200 includes a silicon substrate 201, a lower clad layer 202 composed of a silicone oxide film on the silicon substrate, the core layer 210 for guiding signal light, germanium layers 241, 242 that are formed on the core layer 210 and absorb light, and an upper clad layer 203 is formed on the core layer 210 and germanium layers 241, 242.

In the core layer 210, the p-type silicon slab 211 doped with a p-type impurity ion and p++ silicon electrode sections 212, 213 that are highly-doped with a p-type impurity and act as an electrode are formed. The germanium layers 241, 242 are stacked by epitaxial growth or the like, and have formed thereon the n-type germanium region 215 doped with an n-type impurity. Then, electrodes 216 to 218 are provided on the p++ silicon electrode sections 212, 213 and n-type germanium region 215, respectively, so as to contact them.

The cross section at the position of each of the germanium layers 241, 242 of the germanium photodetector 200 has the same structure as the structure in FIG. 2, as illustrated in FIG. 6. On the other hand, in the cross section between the germanium layers 241, 242, as illustrated in FIG. 7, with respect to the structure illustrated in FIG. 6, the electrodes 216, 218 remain but only the portion inside the upper clad layer 203 of the electrode 217 and the germanium layer 241 are omitted.

In this embodiment, two germanium layers 241, 242 are provided on the p-type silicon slab 211 so as to make the germanium crystal small, so that the threading dislocation is difficult to be generated, and the area of the surface of the individual germanium layer in contact with the electrode 217 is miniaturized, so that the dark current due to threading dislocation can be reduced.

However, if the germanium layer is miniaturized, the light absorption region becomes smaller, and therefore a sufficient photocurrent might not be able to be obtained. Therefore, as illustrated in FIG. 5, two germanium layers 241, 242 are arranged in series in the travelling direction of light so as to obtain a sufficient light absorption region.

Second Embodiment

Figure 9:
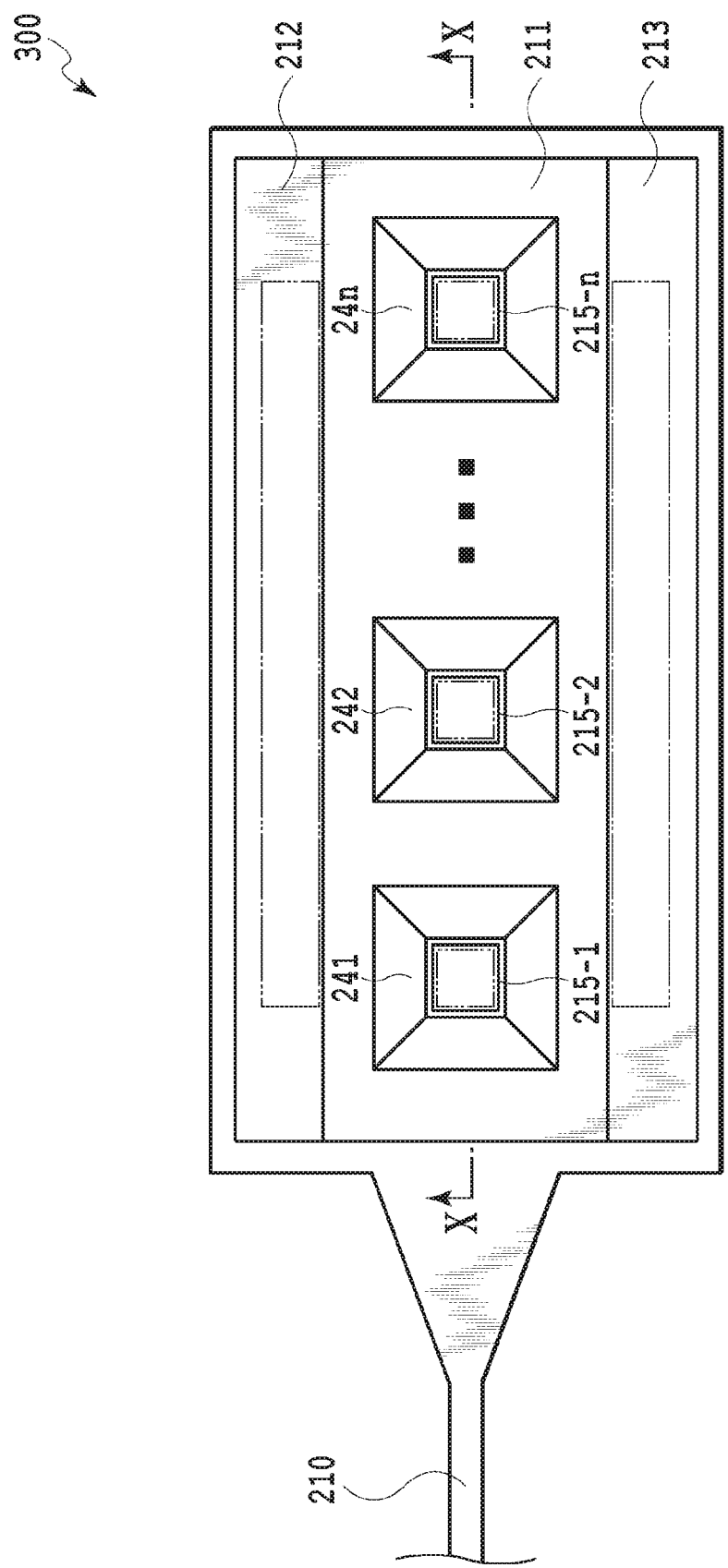
FIG. 9 is a plan view illustrating only the core layer 210 and germanium layers 241, 242 of a germanium photodetector according to a second embodiment of the present invention.
Figure 10:
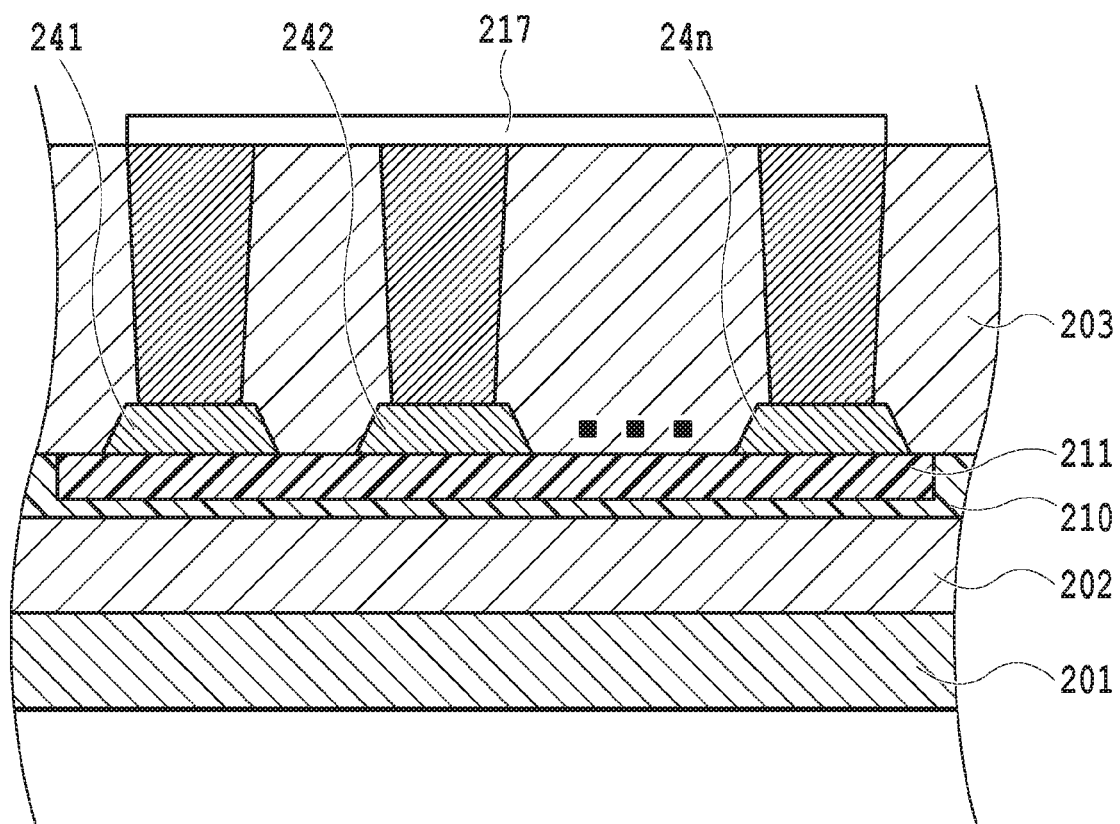
FIG. 10 is the cross sectional view along X-X in FIG. 9.

FIG. 9 is a plan view obtained by omitting an upper clad layer, an n-type germanium region doped with an n-type impurity above a germanium layer, and electrodes of a germanium photodetector 300 according to a second embodiment of the present invention. Moreover, FIG. 10 is the cross sectional view along X-X in FIG. 9.

For ease of understanding, FIG. 9 illustrates only the core layer 210, the p-type silicon slab 211 doped with a p-type impurity ion and formed in a part of the core layer 210, the p++ silicon electrode sections 212, 213 that are highly-doped with a p-type impurity and act as an electrode, germanium layers 241, 242, . . . , 24n (n: positive integer) which absorb light, and n-type germanium regions 215-1, 215-2, . . . , 215-n, but omits the upper clad layer and the electrode. Note that, the cross section at the position of each of the germanium layers 241, 242, . . . , 24n (n: positive integer) of the germanium photodetector 300 has the same structure as the structure in FIG. 6. Moreover, in FIG. 9, the positions at which the electrode is in contact with the p++ silicon electrode sections 212, 213 and the n-type germanium regions 215-1, 215-2, . . . , 215-n, respectively, are indicated by two-dot chain lines.

In this embodiment, a plurality of germanium layers 241, 242, . . . , 24n is provided on the p-type silicon slab 211 so as to make the germanium crystal small, so that the threading dislocation is difficult to be generated, and the area of the surface of the individual germanium layer in contact with the electrode 217 is miniaturized, so that the dark current due to threading dislocation can be reduced. As with the first embodiment, as illustrated in FIG. 9 the plurality of germanium layers 241, 242, . . . , 24n is arranged in series in the travelling direction of light so as to obtain a sufficient light absorption region.

Third Embodiment

Figure 11:
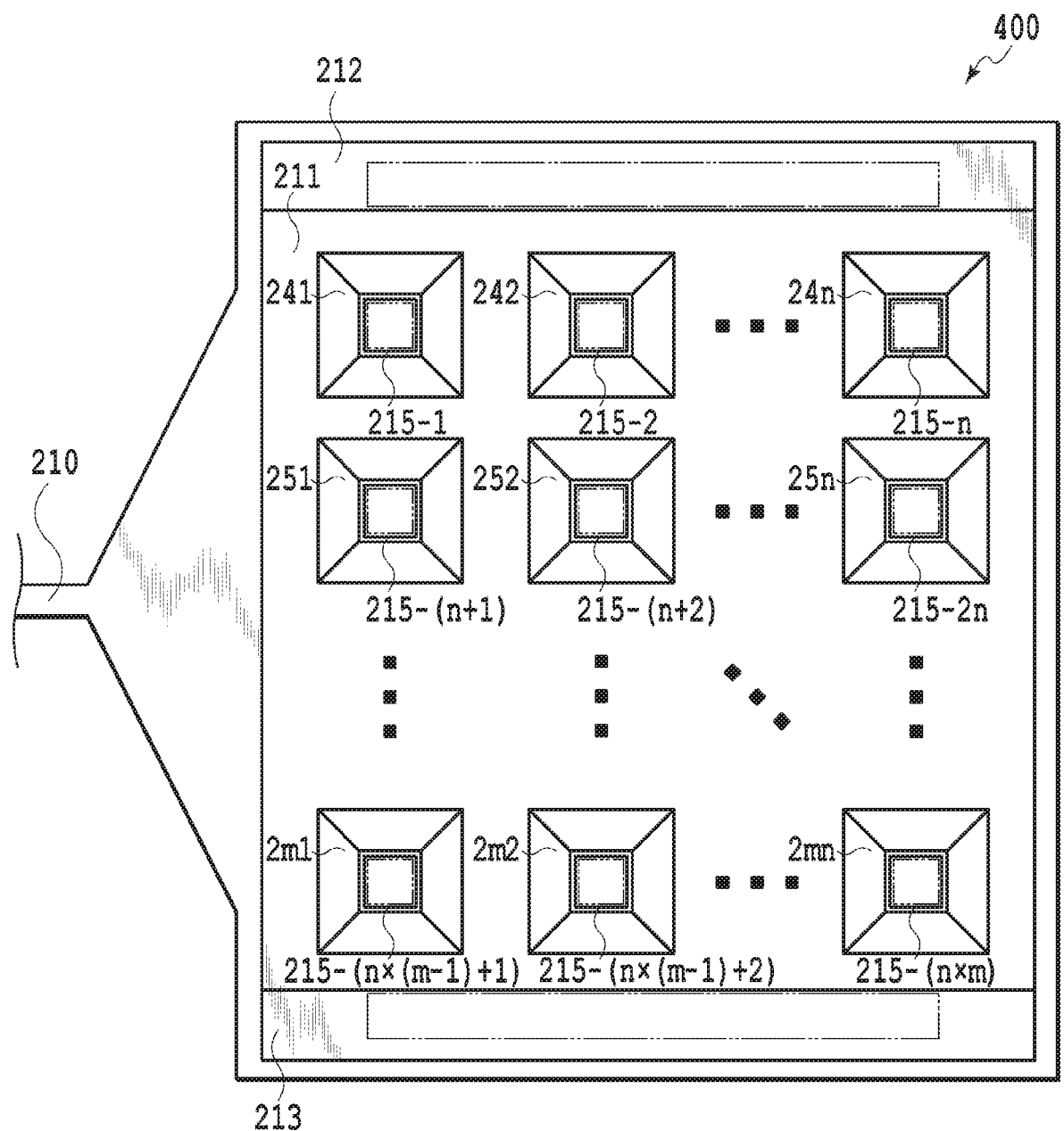
FIG. 11 is a plan view illustrating only the core layer 210 and germanium layers 241 to 2mn of a germanium photodetector according to a third embodiment of the present invention.

FIG. 11 is a plan view obtained by omitting an upper clad layer, an n-type germanium region doped with an n-type impurity above a germanium layer, and electrodes of a germanium photodetector 400 according to a third embodiment of the present invention.

For ease of understanding, FIG. 11 illustrates only the core layer 210, the p-type silicon slab 211 doped with a p-type impurity ion and formed in a part of the core layer 210, the p++ silicon electrode sections 212, 213 that are highly-doped with a p-type impurity and act as an electrode, germanium layers 241, 242, . . . , 24n, . . . , 2m1, 2m2, . . . , 2mn (n, m: positive integer) which absorb light, and n-type germanium regions 215-1, 215-2, . . . , 215-(n× m). Note that the cross section at the position of each of the germanium layers 241, 242, . . . , 24n, . . . , 2m1, 2m2, . . . , 2mn of the germanium photodetector 400 has the same structure as the structure in FIG. 6. Moreover, in FIG. 11, the positions at which the electrode is in contact with the p++ silicon electrode sections 212, 213 and the n-type germanium regions 215-1, 215-2, . . . , 215-(n×m), respectively, are indicated by two-dot chain lines.

In this embodiment, the plurality of germanium layers 241, 242, . . . , 24n, . . . , 2m1, 2m2, . . . , 2mn is provided on the p-type silicon slab 211 so as to make the germanium crystal small, so that the threading dislocation is difficult to be generated, and the area of the surface of the individual germanium layer in contact with the electrode is miniaturized, so that the dark current due to threading dislocation can be reduced. Here, a plurality of germanium layers 241, 242, . . . , 24n, . . . , 2m1, 2m2, . . . , 2mn is arranged in series and in parallel in the travelling direction of light so as to obtain a sufficient light absorption region.

Fourth Embodiment

Figure 12:
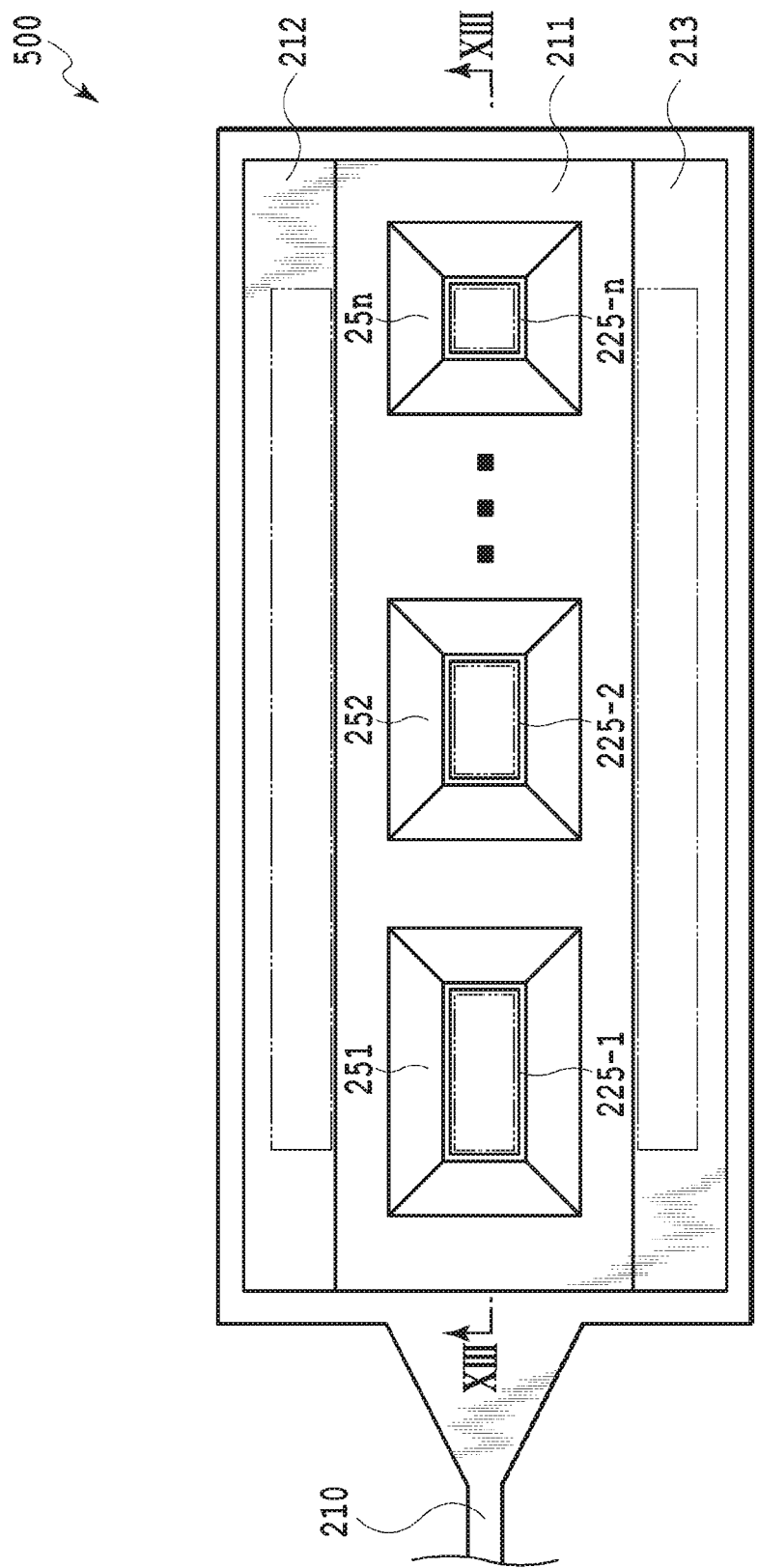
FIG. 12 is a plan view illustrating only the core layer 210 and germanium layers 251 to 25n of a germanium photodetector according to a fourth embodiment of the present invention.
Figure 13:
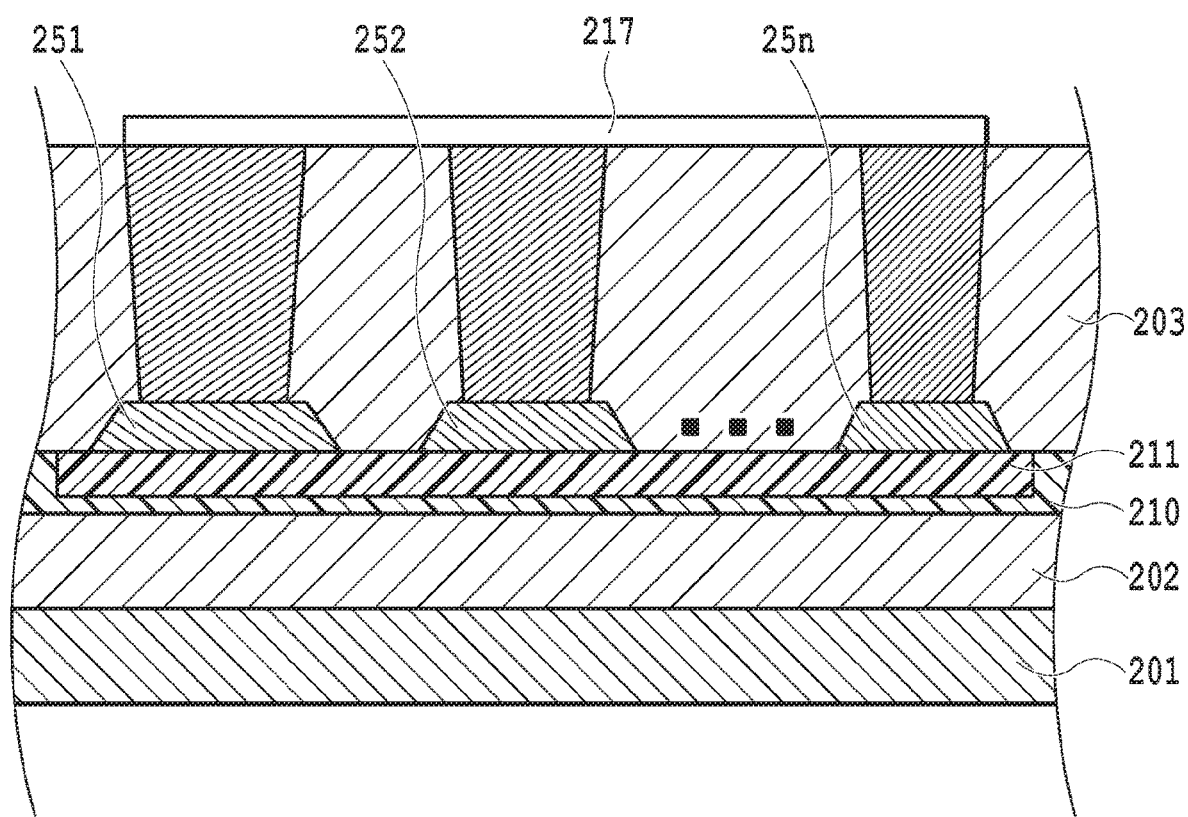
FIG. 13 is the cross sectional view along XIII-XIII in FIG. 12.

FIG. 12 is a plan view obtained by omitting an upper clad layer, an n-type germanium region doped with an n-type impurity above a germanium layer, and electrodes of a germanium photodetector 500 according to a fourth embodiment of the present invention. FIG. 13 illustrates the cross section along XIII-XIII in FIG. 12. In contrast to the second embodiment, in this embodiment, it is so configured that the sizes of the germanium layers 251, 252, . . . , 25n (n: positive integer) and n-type germanium regions 225-1, 225-2, . . . , 225-n are not uniform. FIGS. 12 and 13 illustrate a configuration, as an example, in which the sizes of the germanium layers 251, 252, . . . , 25n and n-type germanium regions 225-1, 225-2, . . . , 225-n gradually decrease from the input terminal side.

For ease of understanding, FIG. 12 illustrates only the core layer 210, the p-type silicon slab 211 doped with a p-type impurity ion and formed in a part of the core layer 210, the p++ silicon electrode sections 212, 213 that are highly-doped with a p-type impurity and act as an electrode, germanium layers 251, 252, . . . , 25n which absorb light, and n-type germanium regions 225-1, 225-2, . . . , 225-n, and omits the upper clad layer and the electrode. Note that the cross section at the position of each of the germanium layers 251, 252, . . . , 25n of the germanium photodetector 500 has the same structure as the structure in FIG. 6. Moreover, in FIG. 12, the positions at which the electrode is in contact with the p++ silicon electrode sections 212, 213 and the n-type germanium regions 225-1, 225-2, . . . , 225-n, respectively, are indicated by two-dot chain lines.

In this embodiment, the sizes of the plurality of germanium layers 251, 252, . . . , 25n are gradually reduced on the p-type silicon slab 211 so as to reduce the optical interference due to the regularity of the germanium layers, so that a more uniform wavelength characteristic can be obtained.

Moreover, as with the first to third embodiments, the germanium crystal is made small, so that the threading dislocation is difficult to be generated, and the area of the surface of the individual germanium layer in contact with the p-type silicon slab 211 is miniaturized so as to reduce the dark current due to threading dislocation, and at the same time, a plurality of germanium layers 251, 252, . . . , 25n is arranged in series in the travelling direction of light so as to obtain a sufficient light absorption region.

Fifth Embodiment

Figure 14A:
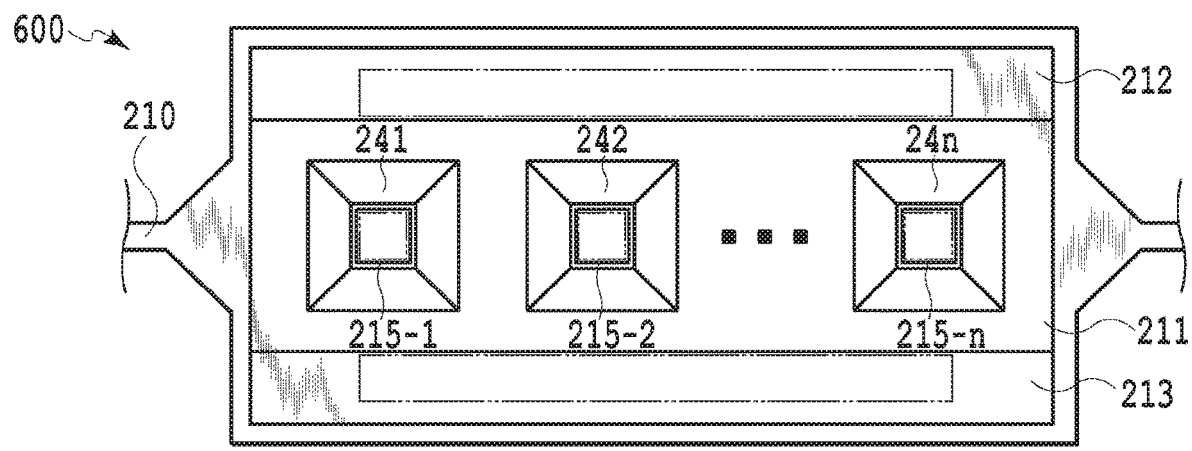
FIG. 14A is a plan view illustrating only the core layer 210 and germanium layers 241 to 24n of a germanium photodetector according to a fifth embodiment of the present invention.
Figure 14B:
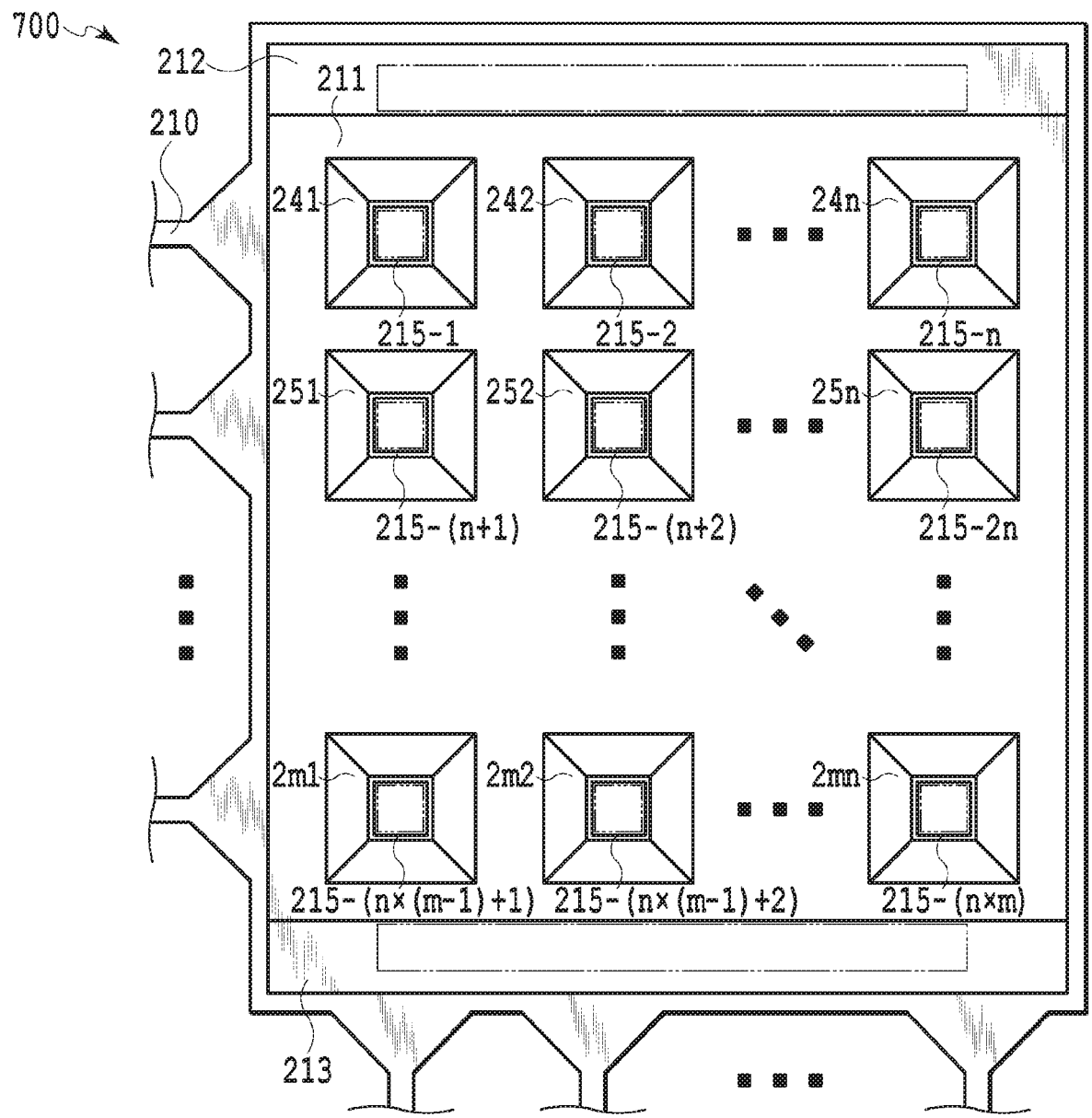
FIG. 14B is a plan view illustrating only the core layer 210 and germanium layers 241 to 2mn of another germanium photodetector according to the fifth embodiment of the present invention.

FIGS. 14A and 14B are plan views obtained by omitting an upper clad layer, an n-type germanium region doped with an n-type impurity above a germanium layer, and electrodes of germanium photodetectors 600, 700 according to a fifth embodiment of the present invention. In this embodiment, it is so configured that the core layer 210 includes a plurality of input waveguide sections, and that incident light is branched to enter each of the plurality of input waveguide sections. The configuration of this embodiment is the same as that of the second and third embodiments except that the core layer 210 includes the plurality of input waveguide sections. Although an example of the configuration provided with the plurality of input waveguide sections is illustrated in FIGS. 14A and 14B, the positions of the plurality of input waveguide sections are not limited thereto, but the plurality of input waveguide sections can be provided at any position. Note that the germanium photodetector according to this embodiment is a lumped circuit which does not require a circuit for attaining a speed matching between an electric signal and an optical signal unlike a distributed constant circuit.

In addition to the effects exhibited by the second and third embodiments, this embodiment achieves an improvement of the maximum optical input intensity due to the dispersion effect of photocurrent, and a reduction in size of the device due to an increase of the effective germanium region.

Figure 15:
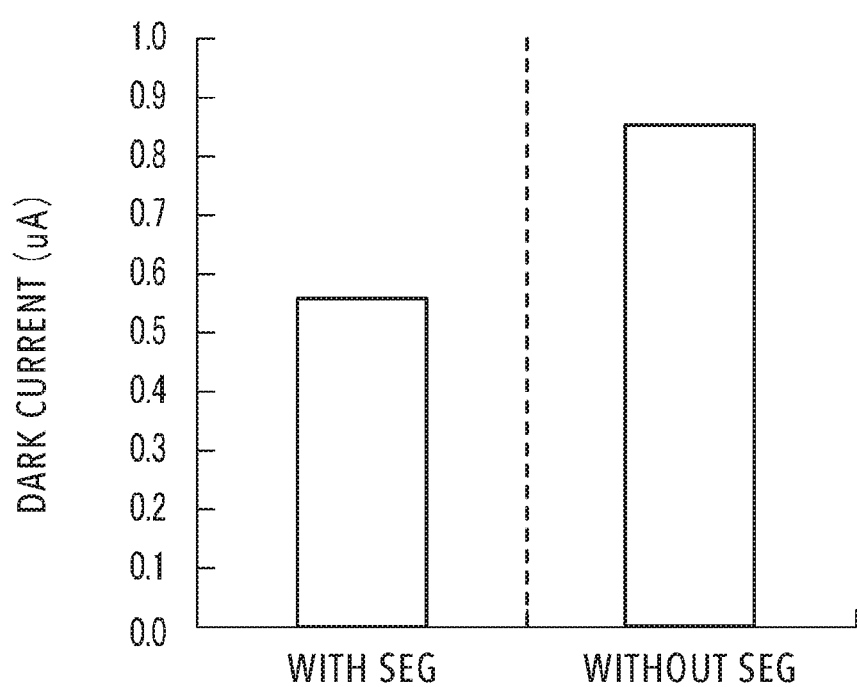
FIG. 15 illustrates the measurement results of the dark current in a case where the area of the surface in contact with a silicon slab is reduced by arranging two germanium layers in series (with an SEG) and in a case where there is one conventional germanium layer (without an SEG)

FIG. 15 illustrates the measurement results of the dark current in a case where the area of the surface in contact with a silicon slab is reduced by arranging two germanium layers in series (with an SEG) as in FIG. 5 and in a case where there is one conventional germanium layer (without an SEG). The width in the shorter-length direction of the germanium layer is 8 μm, the length in the longer-length direction of each germanium layer is 9 μm in the case where there is an SEG, and the length in the longer-length direction of the germanium layer is 20 μm in the case where there is no SEG.

As explained above, by reducing the area of a region in contact with the electrode of the germanium layer, the dark current can be significantly reduced.

Figure 16:
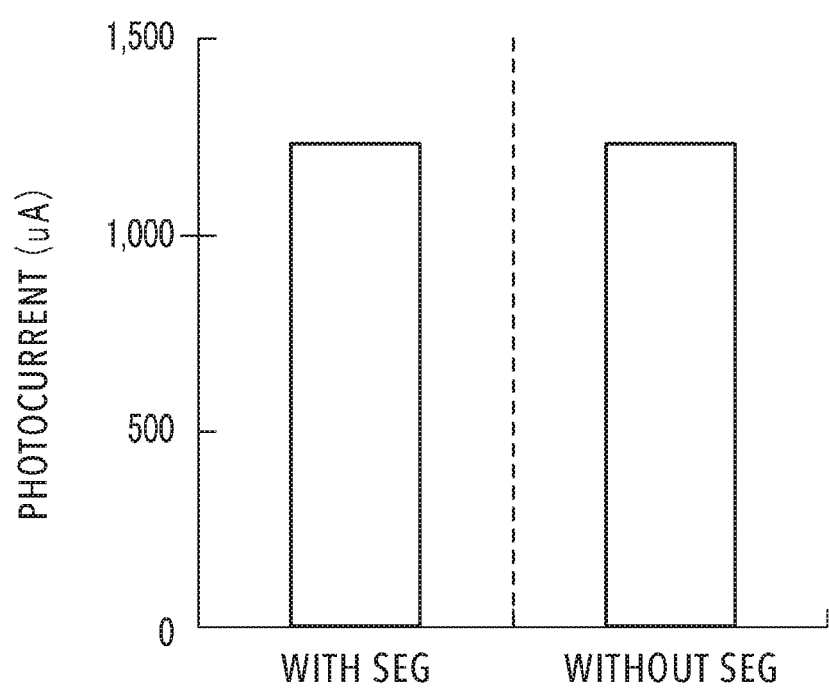
FIG. 16 illustrates the measurement results of the photocurrent in a case where the area of the surface in contact with a silicon slab is reduced by arranging two germanium layers in series (with an SEG) and in a case where there is one conventional germanium layer (without an SEG).

FIG. 16 illustrates the measurement results of the photocurrent in a case where the area of the surface in contact with the electrode is reduced by arranging two germanium layers in series (with an SEG) as in FIG. 5 and in a case where there is one conventional germanium layer (without an SEG). As with FIG. 15, the width in the shorter-length direction of the germanium layer is 8 μm, the length in the longer-length direction of each germanium layer is 9 μm in the case where there is an SEG, and the length in the longer-length direction of the germanium layer is 20 μm in the case where there is no SEG.

As explained above, by arranging a plurality of germanium photodetectors in series in the travelling direction of light, a sufficient photocurrent similar to the conventional one is obtained.

From the above, according to the present invention, only the dark current can be reduced without degradation of the photocurrent of a germanium photodetector.

REFERENCE SIGNS LIST 100, 200, 300, 400, 500, 600, 700 germanium photodetector
101, 201 silicon substrate
102, 202 lower clad layer
103, 203 upper clad layer
110, 210 core layer
111, 211 p-type silicon slab
112, 113, 212, 213 p++ silicon electrode section
114, 241 to 2mn, 251 to 25n germanium layer
115, 215-1 to 215 (n×m), 225-1 to 225-n n-type germanium region
116 to 118, 216 to 218 electrode

The invention claimed is:

1. A photodetector comprising:
a silicon substrate;
a lower clad layer formed on the silicon substrate;
a core layer that is formed on the lower clad layer and includes a p-type silicon slab doped with a p-type impurity ion;
a germanium layer that is formed on the p-type silicon slab and includes an n-type germanium region doped with an n-type impurity;
an upper clad layer formed on the core layer and the germanium layer; and
electrodes connected to the p-type silicon slab and the n-type germanium region, respectively, wherein
the germanium layer is fragmented into a plurality of regions and has a plurality of surfaces in contact with the p-type silicon slab,
wherein the plurality of regions are separated from each other,
wherein the plurality of surfaces are separated from each other, and
wherein the surfaces in contact with the p-type silicon slab of the germanium layer are arranged in series in a travelling direction of light.

2. The photodetector according to claim 1, wherein
the germanium layer includes the n-type germanium regions in plural corresponding to the plurality of surfaces in contact with the p-type silicon slab, wherein the p-type silicon slab is common to the plurality of n-type germanium regions, and
the electrodes comprise a set of electrodes including at least one first electrode connected to the p-type silicon slab and one second electrode connected to the plurality of n-type germanium regions.

3. The photodetector according to claim 1, wherein the core layer includes a plurality of input waveguide sections.

4. The photodetector according to claim 1, wherein the plurality of surfaces in contact with the p-type silicon slab of the germanium layer each has a different area.

5. The photodetector according to claim 1, wherein the p-type silicon slab includes, on both sides of the germanium layer, a p++ silicon electrode section highly-doped with a p-type impurity, and the electrode connected to the p-type silicon slab is in contact with the p++ silicon electrode section.

6. The photodetector according to claim 1, wherein the surfaces in contact with the p-type silicon slab of the germanium layer are arranged in parallel in the travelling direction of light.

* * * * *

UNITED STATES PATENT AND TRADEMARK OFFICE
CERTIFICATE OF CORRECTION

PATENT NO. : 10,720,543 B2
APPLICATION NO. : 15/751795
DATED : July 21, 2020
INVENTOR(S) : Fukuda et al.

Page 1 of 1

It is certified that error appears in the above-identified patent and that said Letters Patent is hereby corrected as shown below:

On the Title Page

Item (22), PCT Filed, change "August 28, 2016" to --August 26, 2016--

Signed and Sealed this
Twenty-fourth Day of November, 2020

Andrei Iancu
*Director of the United States Patent and Trademark Office*